United States Patent
Hasuike

(10) Patent No.: US 9,070,707 B2
(45) Date of Patent: Jun. 30, 2015

(54) SEMICONDUCTOR DEVICE

(71) Applicant: Mitsubishi Electric Corporation, Tokyo (JP)

(72) Inventor: Atsushi Hasuike, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 72 days.

(21) Appl. No.: 14/029,879

(22) Filed: Sep. 18, 2013

(65) Prior Publication Data

US 2014/0167081 A1 Jun. 19, 2014

(30) Foreign Application Priority Data

Dec. 19, 2012 (JP) ................. 2012-277201

(51) Int. Cl.
*H01L 33/00* (2010.01)
*H01L 29/66* (2006.01)
*H01L 29/778* (2006.01)
*H01L 29/20* (2006.01)

(52) U.S. Cl.
CPC ...... *H01L 29/66462* (2013.01); *H01L 29/7787* (2013.01); *H01L 29/2003* (2013.01)

(58) Field of Classification Search
CPC .................................................. H01L 33/002
USPC .......................................................... 257/94
See application file for complete search history.

(56) References Cited

U.S. PATENT DOCUMENTS

2009/0284132 A1* 11/2009 Tamaki et al. ................ 313/503

FOREIGN PATENT DOCUMENTS

| JP | 2006-286746 A | 10/2006 |
| JP | 2008-47767 A | 2/2008 |
| JP | 2008-198731 A | 8/2008 |

OTHER PUBLICATIONS

Kondo, M., et al., "Study of Light Emitting Device Based-on AlGaN/GaN:Eu HEMT structure", *IEICE Technical Report*, vol. 110, No. 31, pp. 11-16, (2010).
Fujiwara, Y., et al., "Organometallic vapor phase epitaxial growth and luminescent properties of Eu-doped GaN-based red light-emitting diodes", *Manufacturing and Technology*, vol. 62, No. 4, pp. 57-60, (2010).

* cited by examiner

*Primary Examiner* — Theresa T Doan
(74) *Attorney, Agent, or Firm* — Leydig, Voit & Mayer, Ltd.

(57) ABSTRACT

A semiconductor device includes: a substrate; a semiconductor layer composed of GaN-based compound semiconductor on the substrate; a source electrode, a gate electrode, and a drain electrode on the substrate; and an additive substance added to the semiconductor layer. The additive substance serves as a luminescent center within the semiconductor layer. Charge trapped at an energy level in the semiconductor layer is released and recombined by light generated from the luminescent center.

10 Claims, 3 Drawing Sheets

SEMICONDUCTOR DEVICE

BACKGROUND OF THE INVENTION

1. Field of the Invention

The present invention relates to semiconductor devices such as field effect transistors composed of GaN-based compound semiconductor.

2. Background Art

GaN-based compound semiconductors such as GaN, InGaN, AlGaN, and AlInGaN have a higher bandgap energy than other Group III-V compound semiconductors, e.g., GaAs-based compound semiconductors. Therefore, electronic devices formed using GaN-based compound semiconductor material have resistance to high temperatures and exhibit excellent operating characteristics at elevated temperatures. Research has been conducted in recent years on high electron mobility transistors composed of GaN-based compound semiconductor.

Such high electron mobility transistors are disadvantageous in that the SiC substrate and the GaN-based compound semiconductor layer formed thereon have a large difference in lattice constant, resulting in many defects in the semiconductor layer. Charge is trapped in these defects and at the interface between the semiconductor layer and the overlying passivation film and later released. This causes hysteresis in the source-drain current vs. voltage characteristic of the high electron mobility transistor when the transistor operates at high voltage and high power levels, resulting in a decrease in the drain current, a phenomenon called current collapse. If such a transistor is used in a system that receives varying power, there will be a temporary drop, or slump, in the output power of the system.

In order to overcome this problem, a semiconductor device has been proposed in which a luminescent layer is provided on the top surface side or bottom surface side of the transistor so that trapped charge is released and recombined by the light generated by the luminescent layer (see, e.g., Japanese Laid-Open Patent Publication No. 2006-286746).

SUMMARY OF THE INVENTION

However, the manufacture of such a conventional semiconductor device requires that a luminescent layer and electrodes for supplying a current to the luminescent layer be additionally formed on the transistor, resulting in increased manufacturing cost.

In view of the above-described problems, an object of the present invention is to provide a semiconductor device which minimizes current collapse and decreases manufacturing cost.

According to the present invention, a semiconductor device includes: a substrate; a semiconductor layer composed of GaN-based compound semiconductor on the substrate; a source electrode, a gate electrode, and a drain electrode on the substrate; and an additive substance added to the semiconductor layer. The additive substance serves as a luminescent center within the semiconductor layer. A charge trapped at an energy level in the semiconductor layer is released and recombined by light generated from the luminescent center.

The present invention makes it possible to provide a semiconductor device which minimizes current collapse and decreases manufacturing cost.

Other and further objects, features and advantages of the invention will appear more fully from the following description.

DETAILED DESCRIPTION OF THE PREFERRED EMBODIMENTS

Figure 1:
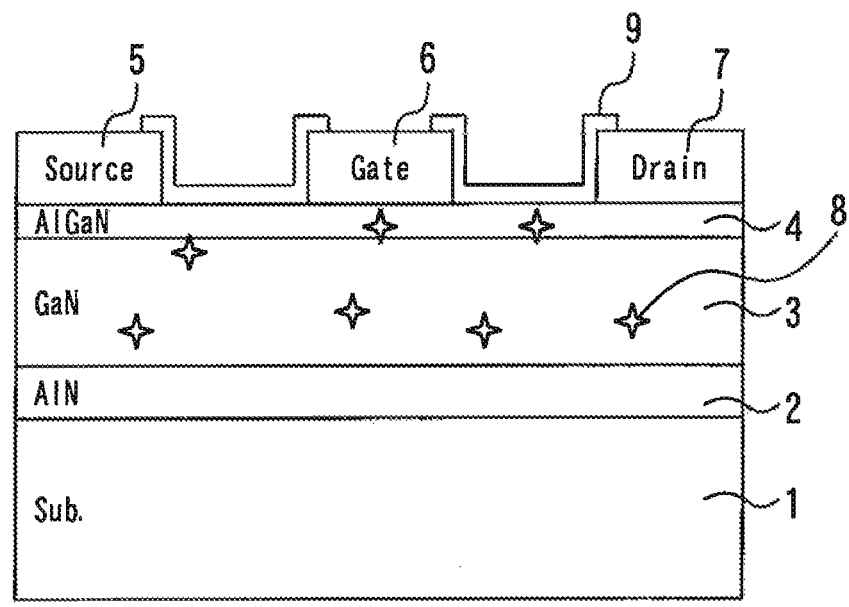
FIG. 1 is a cross-sectional view of a semiconductor device in accordance with an embodiment of the present invention.

FIG. 1 is a cross-sectional view of a semiconductor device in accordance with an embodiment of the present invention. This semiconductor device is a high electron mobility transistor of GaN-based compound semiconductor material.

A buffer layer 2 of AlN, an undoped GaN layer 3, and an undoped AlGaN layer 4 are sequentially provided on a substrate 1 of sapphire, Si, or GaN, etc.

A source electrode 5, a gate electrode 6, and a drain electrode 7 are provided on the AlGaN layer 4. It should be noted that in order to reduce the contact resistance between the electrodes 5,7 and the AlGaN layer 4, an n-type GaN contact layer having a high impurity concentration may be provided between them. The GaN layer 3 and the AlGaN layer 4 contain Eu as an additive substance 8. The additive substance 8 serves as luminescent centers within the GaN layer 3 and the AlGaN layer 4. A passivation film 9 is provided on the AlGaN layer 4.

Figure 2:
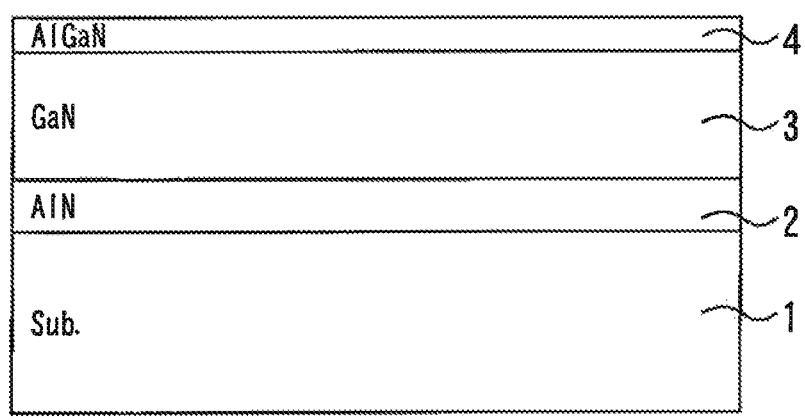
FIGS. 2 to 4 are cross-sectional views showing the manufacturing process of the semiconductor device of the present embodiment.
Figure 3:
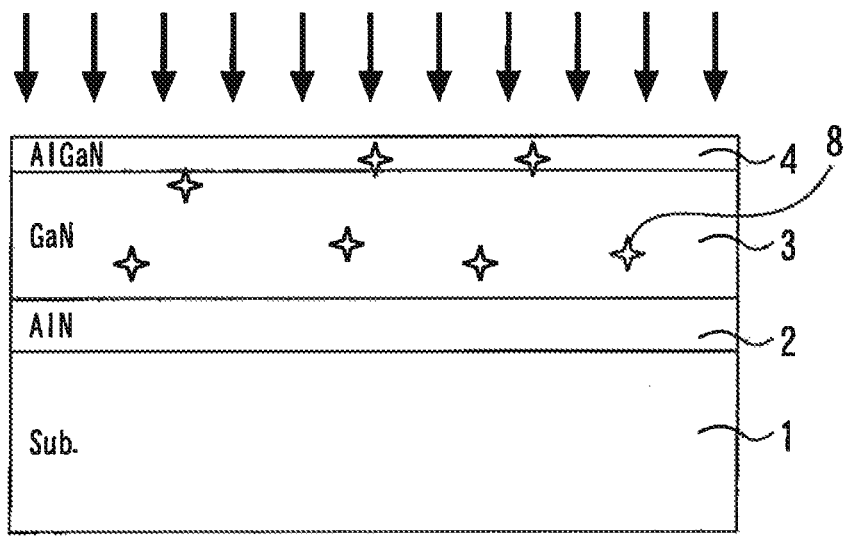
Figure 4:
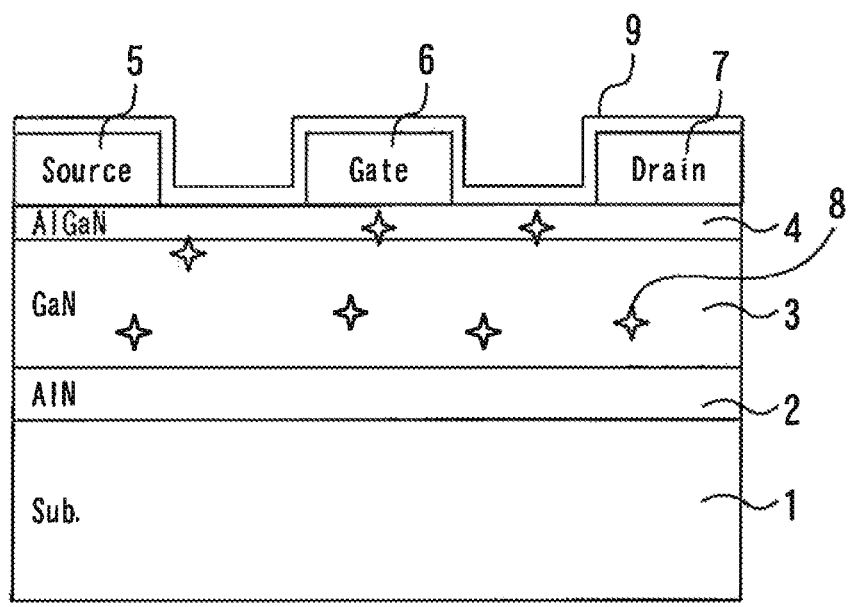

A method of manufacturing a semiconductor device in accordance with the present embodiment will now be described. FIGS. 2 to 4 are cross-sectional views showing the manufacturing process of the semiconductor device of the present embodiment.

First, as shown in FIG. 2, a buffer layer 2, a GaN layer 3, and an AlGaN layer 4 are sequentially formed on a substrate 1. Next, as shown in FIG. 3, an additive substance 8, namely Eu, is added to the GaN layer 3 and the AlGaN layer 4 by ion implantation, etc. Then, as shown in FIG. 4, a source electrode 5, a gate electrode 6, and a drain electrode 7 are formed on the AlGaN layer 4, and a passivation film 9 is formed on these electrodes and the AlGaN layer 4. Openings are then formed in the passivation film 9 on the electrodes, completing the manufacture of the device shown in FIG. 1.

Figure 5:
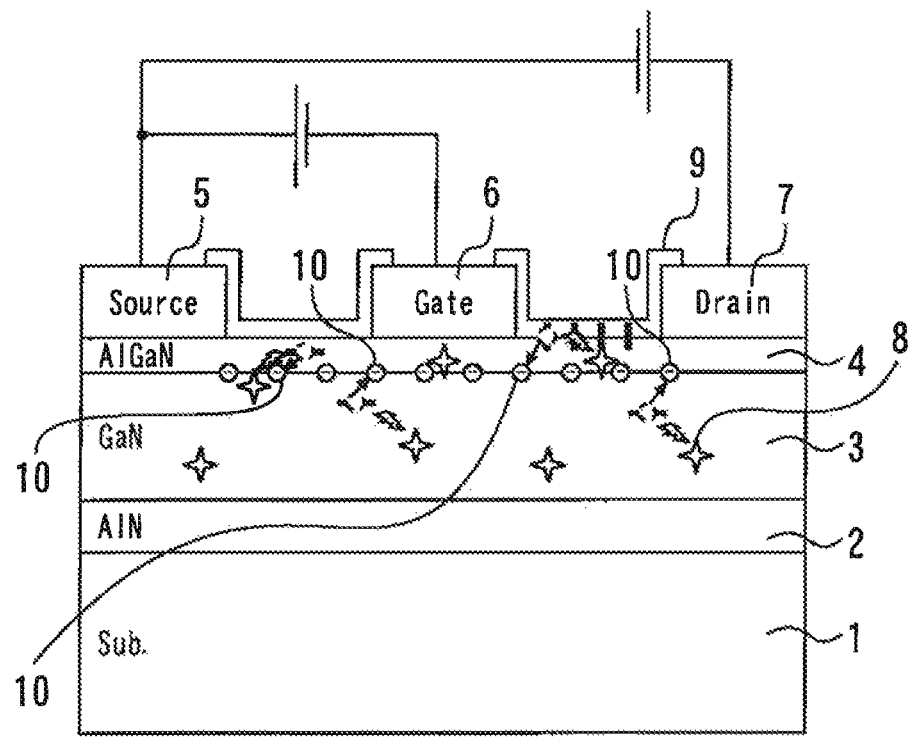
FIG. 5 is a cross-sectional view showing the operating state of the semiconductor device of the present embodiment.

The operation of the semiconductor device of the present embodiment will now be described. FIG. 5 is a cross-sectional view showing the operating state of the semiconductor device of the present embodiment. Two-dimensional electron gas is formed immediately below the heterojunction interface between the GaN layer 3 and the AlGaN layer 4 due to the piezoelectric effect associated with spontaneous polarization and crystalline strain. In this state, a voltage is applied between the source electrode 5 and the drain electrode 7 so that electrons which have been supplied to the GaN layer 3 travel through the two-dimensional electron gas to the drain electrode 7. During the travel of the electrons, the voltage applied to the gate electrode 6 may be varied to vary the thickness of the depleted layer formed immediately below the gate electrode 6 and thereby control the electrons traveling through the two-dimensional electron gas. Such operation of the transistor results in light emission from the luminescent centers formed by the additive substance 8.

Figure 6:
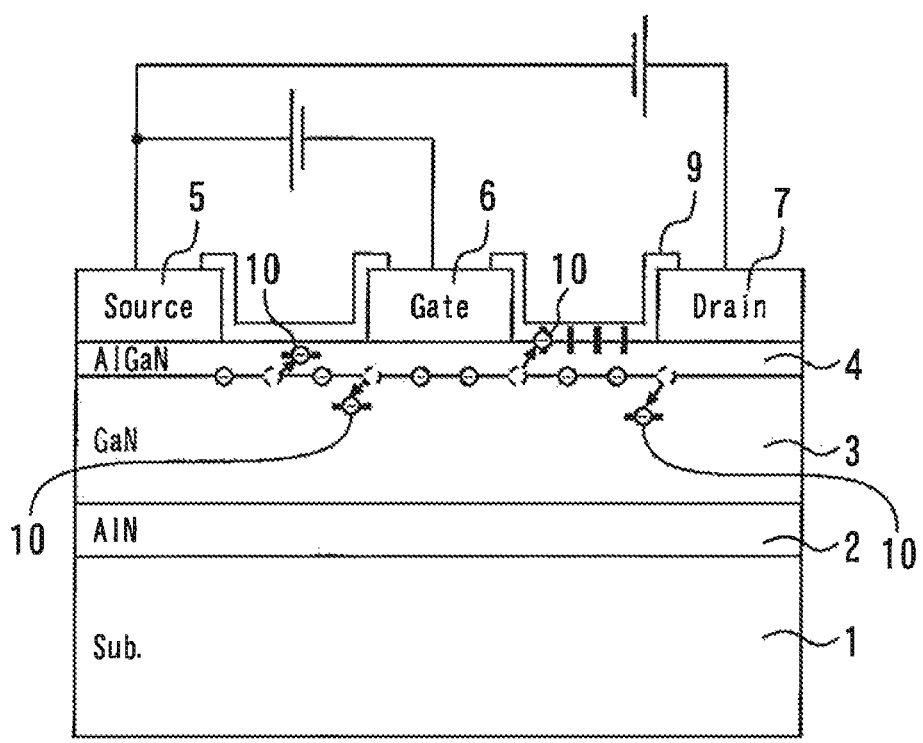
FIG. 6 is a cross-sectional view showing the operating state of a comparative conventional semiconductor device.

Advantages of the semiconductor device of the present embodiment will be described in comparison with a comparative example. FIG. 6 is a cross-sectional view showing the operating state of a comparative conventional semiconductor device. The GaN layer 3 and the AlGaN layer 4 of this comparative semiconductor device do not contain the additive substance 8. As a result, charge 10 is trapped at energy levels in the GaN layer 3 and the AlGaN layer 4 and at the interface between the AlGaN layer 4 and the passivation film 9, resulting in current collapse.

In the semiconductor device of the present embodiment, on the other hand, the charge 10 trapped at energy levels in the GaN layer 3 and the AlGaN layer 4 and at the interface between the AlGaN layer 4 and the passivation film 9 are released and recombined by the light generated from the luminescent centers formed by the additive substance 8. Since the trapped charge is quickly released in this way, the amount of charge supplied to the transistor does not decrease and hence current collapse is minimized. This makes it possible to minimize temporary reduction in the output power of the semiconductor device. Further, there is no need for the semiconductor device to have a conventional configuration in which a luminescent layer and electrodes for supplying a current to the luminescent layer are additionally formed on the transistor, resulting in decreased manufacturing cost.

It should be noted that although the present embodiment has been described in connection with a semiconductor device which contains Eu as an additive substance 8 for forming luminescent centers, it is to be understood that the additive substance 8 may be any substance that can be implanted in semiconductor material and caused to emit light; for example, other rare earth elements such as Tm, Er, and Pr may be used. Further, the emission wavelength of the luminescent centers may not be in the visible light wavelength range; the present invention requires only that the emission wavelength be short enough to be able to release trapped charge. It should be noted that since the additive substance 8 (Eu, etc.) acts as an impurity, it slightly affects the amount of current flowing through the transistor, which, however, does not practically affect the operation of the semiconductor device.

Further, although the present embodiment has been described in connection with an FET having an AlGaN/GaN structure, it is to be understood that the present invention is not limited to such FETs, but may be applied to FETs having an AlGaN/AlGaN/GaN structure or FETs having an AlGaN/AlN/GaN structure. Further, the present invention is not limited to high electron mobility transistors, but may be applied to other types of field effect transistors in which buffer layers and channel layers are sequentially provided on a substrate.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-277201, filed on Dec. 19, 2012, including specification, claims, drawings, and summary, on which the Convention priority of the present application is based, is incorporated herein by reference in its entirety.

What is claimed is:

1. A semiconductor device comprising:
   a substrate;
   a semiconductor layer composed of a GaN-based compound semiconductor and that is supported by the substrate;
   a source electrode, a gate electrode, and a drain electrode on the semiconductor layer; and
   an additive substance contained within the semiconductor layer, wherein
      the additive substance produces luminescent light within the semiconductor layer in response to electrical current flow within the semiconductor layer, and
      electrical charge trapped at an energy level within the semiconductor layer is released and recombined in response to the luminescent light produced by the additive substance.

2. The semiconductor device according to claim 1, wherein the additive substance is a rare earth element.

3. The semiconductor device according to claim 1, further comprising a passivation film on the semiconductor layer, wherein electrical charge trapped at an interface between the semiconductor layer and the passivation film is released and recombined in response to the luminescent light produced by the additive substance.

4. The semiconductor device according to claim 2, wherein the rare earth element is selected from the group consisting of europium, thulium, erbium, and praseodymium.

5. A semiconductor device comprising:
   a substrate;
   a semiconductor layer composed of a GaN-based compound semiconductor and that is supported by the substrate;
   a source electrode, a gate electrode, and a drain electrode on the semiconductor layer; and
   atoms of a rare earth element contained within the semiconductor layer, wherein
      the atoms of the rare earth element produce luminescent light within the semiconductor layer in response to electrical current flow within the semiconductor layer, and
      electrical charge trapped within the semiconductor layer is released and recombined in response to the luminescent light produced by the atoms of the rare earth element.

6. The semiconductor device according to claim 5, further comprising a passivation film on the semiconductor layer, wherein electrical charge trapped at an interface between the semiconductor layer and the passivation film is released and recombined in response to the luminescent light produced by the atoms of the rare earth element.

7. The semiconductor device according to claim 5, wherein the atoms of the rare earth element are selected from the group consisting of europium atoms, thulium atoms, erbium atoms, and praseodymium atoms.

8. A semiconductor device comprising:
   a substrate;
   a first semiconductor layer composed of a first GaN-based compound semiconductor and that is supported by the substrate;
   a second semiconductor layer composed of a second GaN-based compound semiconductor material that is different in composition from the first GaN-based compound semiconductor and that is in contact with the first semiconductor layer;
   a source electrode, a gate electrode, and a drain electrode on the second semiconductor layer; and
   atoms of a rare earth element contained within the first and second semiconductor layers, wherein
      the atoms of the rare earth element produce luminescent light within the first and second semiconductor layers in response to electrical current flow within the first and second semiconductor layers,
      electrical charge trapped within the first and second semiconductor layers is released and recombined in response to the luminescent light produced by the atoms of the rare earth element, and the semiconductor device is a high electron mobility field effect transistor.

9. The semiconductor device according to claim 8, further comprising a passivation film on the second semiconductor layer, wherein charge trapped at an interface between the second semiconductor layer and the passivation film is released and recombined in response to the luminescent light produced by the atoms of the rare earth element.

10. The semiconductor device according to claim 8, wherein the atoms of the rare earth element are selected from the group consisting of europium atoms, thulium atoms, erbium atoms, and praseodymium atoms.

* * * * *